US 12,370,921 B2

(12) United States Patent
Chang et al.

(10) Patent No.: US 12,370,921 B2
(45) Date of Patent: Jul. 29, 2025

(54) EARLY DETECTION OF BATTERY CELL PERFORMANCE DEGRADATION

(71) Applicant: GM GLOBAL TECHNOLOGY OPERATIONS LLC, Detroit, MI (US)

(72) Inventors: Insu Chang, Troy, MI (US); Hanho Yun, Oakland Township, MI (US); Jun-mo Kang, Ann Arbor, MI (US); Chen-fang Chang, Bloomfield Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 225 days.

(21) Appl. No.: 18/341,176

(22) Filed: Jun. 26, 2023

(65) Prior Publication Data

US 2024/0424945 A1 Dec. 26, 2024

(51) Int. Cl.
*B60L 58/12* (2019.01)
*G01R 31/396* (2019.01)
(Continued)

(52) U.S. Cl.
CPC ............ *B60L 58/12* (2019.02); *G01R 31/396* (2019.01); *H01M 10/441* (2013.01);
(Continued)

(58) Field of Classification Search
CPC ........ B60L 58/12; B60L 3/0046; B60L 58/16; B60L 58/21; B60L 2240/545;
(Continued)

(56) References Cited

U.S. PATENT DOCUMENTS

| 10,073,143 | B2 | 9/2018 | Leidich et al. |
| 2021/0325475 | A1* | 10/2021 | Bae .................. G01R 31/3835 |
| 2023/0282898 | A1 | 9/2023 | Kratzer |

FOREIGN PATENT DOCUMENTS

| DE | 102014204956 A1 | 9/2015 |
| DE | 102020117706 A1 | 1/2022 |
| EP | 4113140 A1 | 1/2023 |

OTHER PUBLICATIONS

DE Office Action for Appln No. 10 2023 127 049.4 dated Apr. 16, 2024, 6 pages.

* cited by examiner

*Primary Examiner* — Rodney A Butler
(74) *Attorney, Agent, or Firm* — CANTOR COLBURN LLP (57) ABSTRACT

Aspects of the disclosure include the detection of battery cell degradation. An exemplary battery management system can include a memory, computer readable instructions, and one or more processors that perform operations that include: responsive to determining that a charging state has completed, measuring a first cell voltage of a cell of the battery pack; responsive to the first cell voltage exceeding a reference voltage, measuring a second cell voltage of the cell of the battery pack; responsive to the second cell voltage being equal to the reference voltage, measuring a cell pressure of the cell of the battery pack at the reference voltage; determining a difference between the cell pressure and a prior cell pressure at the reference voltage; and responsive to the difference between the cell pressure and the prior cell pressure exceeding a threshold, identifying the cell of the battery pack as a degraded cell.

20 Claims, 7 Drawing Sheets

(51) Int. Cl.
*H01M 10/44* (2006.01)
*H01M 10/48* (2006.01)
*H01M 10/42* (2006.01)

(52) U.S. Cl.
CPC ....... *H01M 10/443* (2013.01); *H01M 10/482* (2013.01); *H01M 10/488* (2013.01); *H01M 10/425* (2013.01); *H01M 2010/4271* (2013.01); *H01M 2220/20* (2013.01)

(58) Field of Classification Search
CPC ......... B60L 2240/547; B60L 2240/549; B60L 58/22; B60L 58/18; G01R 31/396; G01R 31/374; G01R 31/3835; G01R 31/385; H01M 10/441; H01M 10/443; H01M 10/482; H01M 10/488; H01M 10/425; H01M 2010/4271; H01M 2220/20; H01M 10/48

See application file for complete search history.

EARLY DETECTION OF BATTERY CELL PERFORMANCE DEGRADATION

INTRODUCTION

The subject disclosure relates to battery cell technologies, and particularly to the early detection of battery cell performance degradation.

High voltage electrical systems are increasingly used to power the onboard functions of both mobile and stationary systems. For example, in motor vehicles, the demand to increase fuel economy and reduce emissions has led to the development of advanced electric vehicles (EVs). EVs rely upon Rechargeable Energy Storage Systems (RESS), which typically include one or more high voltage battery packs, and an electric drivetrain to deliver power from the battery to the wheels. Battery packs can include any number of interconnected battery modules depending on the power needs of a given application. Each battery module includes a collection of conductively coupled electrochemical cells. The battery pack is configured to provide a Direct Current (DC) output voltage at a level suitable for powering a coupled electrical and/or mechanical load (e.g., an electric motor).

The capacity of a battery pack can be increased by increasing the number of modules and/or cells in the battery pack, and by increasing the number of parallel core-rolls, the number of electrode layers, and the electrode surface area within each cell of the battery pack. The battery cell chemistry also affects the overall capacity. Two common battery chemistries are the nickel-cobalt-manganese (NCM) battery and the lithium-iron-phosphate (LFP) battery.

SUMMARY

In one exemplary embodiment a vehicle includes an electric motor, a battery pack electrically coupled to the electric motor, and a battery management system coupled to the battery pack. The battery management system includes a memory, computer readable instructions, and one or more processors for executing the computer readable instructions. The computer readable instructions control the one or more processors to perform operations. The operations include detecting a charging state of the battery pack and, responsive to determining that the charging state has completed, measuring a first cell voltage of a cell of the battery pack. The operations further include, responsive to the first cell voltage exceeding a reference voltage, measuring a second cell voltage of the cell of the battery pack and, responsive to the second cell voltage being equal to the reference voltage, measuring a cell pressure of the cell of the battery pack at the reference voltage. A difference between the cell pressure and a prior cell pressure at the reference voltage is determined and, responsive to the difference between the cell pressure and the prior cell pressure exceeding a threshold, cell of the battery pack is identified as a degraded cell.

In addition to one or more of the features described herein, in some embodiments, responsive to determining that the charging state has completed, a charge counter is incremented.

In some embodiments, a cell degradation warning is issued responsive to identifying the cell of the battery pack as a degraded cell.

In some embodiments, a cell balancing is completed to equalize a state of charge among a plurality of cells of the battery pack responsive to identifying the cell of the battery pack as a degraded cell.

In some embodiments, current into or out of the cell is limited during a charging or discharging process responsive to identifying the cell of the battery pack as a degraded cell.

In some embodiments, a charging or discharging current is adjusted to maintain a target temperature condition in the cell responsive to identifying the cell of the battery pack as a degraded cell.

In some embodiments, the cell is isolated by electrically disconnecting the cell from the battery pack responsive to identifying the cell of the battery pack as a degraded cell.

In another exemplary embodiment a battery management system can include a memory, computer readable instructions, and one or more processors for executing the computer readable instructions. The computer readable instructions control the one or more processors to perform operations. The operations include detecting a charging state of a battery pack and, responsive to determining that the charging state has completed, measuring a first cell voltage of a cell of the battery pack. The operations further include, responsive to the first cell voltage exceeding a reference voltage, measuring a second cell voltage of the cell of the battery pack and, responsive to the second cell voltage being equal to the reference voltage, measuring a cell pressure of the cell of the battery pack at the reference voltage. A difference between the cell pressure and a prior cell pressure at the reference voltage is determined and, responsive to the difference between the cell pressure and the prior cell pressure exceeding a threshold, cell of the battery pack is identified as a degraded cell.

In yet another exemplary embodiment a method for detecting battery cell degradation can include detecting a charging state of a battery pack and, responsive to determining that the charging state has completed, measuring a first cell voltage of a cell of the battery pack. A second cell voltage of the cell of the battery pack is measured responsive to the first cell voltage exceeding a reference voltage and, responsive to the second cell voltage being equal to the reference voltage, a cell pressure of the cell of the battery pack is measured at the reference voltage. A difference between the cell pressure and a prior cell pressure at the reference voltage is determined and, responsive to the difference between the cell pressure and the prior cell pressure exceeding a threshold, cell of the battery pack is identified as a degraded cell.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

The following description is merely exemplary in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

As discussed previously, two common battery chemistries are the nickel-cobalt-manganese (NCM) battery and the lithium-iron-phosphate (LFP) battery. While NCM and LFP batteries offer reasonable energy densities and charging/discharging profiles, other battery chemistries, including the lithium metal battery (LMB), are being pursued for next-generation battery solutions.

The main difference between lithium metal batteries and lithium-ion batteries (e.g., LFP batteries) lies in the composition and behavior of their respective anodes (negative electrodes). Lithium metal batteries use metallic lithium for the anode material. During the charging process, lithium ions from the cathode (positive electrode) are deposited onto the lithium metal anode, forming a layer of metallic lithium. This deposition process is known as lithium plating. During discharge, lithium ions are released from the anode and travel through the electrolyte to the cathode, generating an electrical current.

Lithium metal batteries offer several advantages over NCM and LFP batteries. For example, lithium metal batteries have the potential for relatively higher energy densities than NCM and LFP batteries, as the use of metallic lithium as the anode material allows for a higher theoretical specific capacity. In short, more energy can be stored per unit weight or volume in lithium metal batteries. Another advantage is a lower self-discharge rate. This means that lithium metal batteries can retain their charge for a longer duration when not in use, making them more suitable for applications where long-term storage is required. Yet another advantage is the potential for faster charging capabilities. The deposition of metallic lithium during charging can occur at high speeds, enabling rapid charge rates and reducing the charging time compared to NCM and LFP batteries.

Due to the hostless-deposition and dissolution of lithium, lithium metal batteries experience significant volume change (including swelling and shrinking) during charge and discharge. During the charging process, lithium ions are deposited onto the anode as lithium metal, causing the electrode to swell. This reversible expansion is a natural part of the lithium metal battery operation and is known as the lithium plating process. During discharge, the lithium is dissolved back into the electrolyte, resulting in shrinkage of the electrode. These volume changes can cause mechanical stresses within the cell, which may lead to electrode damage, loss of electrical connectivity, and ultimately a reduction in the overall cell performance.

In addition to a reversible expansion/contraction, lithium metal batteries also experience an irreversible cell swelling component as they age. Over time, repeated cycles of lithium deposition and dissolution can cause electrode degradation, leading to the formation of solid electrolyte interface (SEI) layers and other irreversible structural changes. These irreversible swelling phenomena are mainly caused by the gradual accumulation of side reactions, permanent dendrite formation, and the growth of lithium metal deposits in non-uniform patterns.

The reversible swelling and shrinking and irreversible expansion of lithium metal batteries pose several challenges in battery pack design. For example, a design should be able to accommodate the increasing volume of a lithium metal battery within the limited space of the battery pack. Furthermore, the growth of lithium metal deposits during cycling can lead to the formation of dendrites, needle-like structures that can penetrate the separator between the electrodes and cause short circuits within the cell. These short circuits can result in thermal runaway, where the battery generates excessive heat, leading to the release of electrolytes and gas.

This disclosure introduces a battery management system that leverages cell pressure progression as an indicator of battery cell degradation. Cell pressure progression can be a good indicator of cell degradation in lithium-based batteries and other batteries that require high pressure (e.g., greater than 1,000 kPa) for normal operation as cell pressure progression has been found to exhibit two successive behaviors in these batteries. Initially, cell pressure increases linearly while Coulombic efficiency and cell capacity stay constant. This "linear" regime persists through the initial life of the battery (i.e., from the first cycle to the $N^{th}$ cycle), after which the cell pressure behavior transitions to an "exponential" regime. During the exponential regime, cell pressure increases exponentially between cycles and Coulombic efficiency drops significantly. Without wishing to be bound by theory, it is understood that the transition from linear to exponential behavior occurs when a lithium-based or other high pressure battery degrades beyond a certain level-specifically, after a threshold level of delta-irreversibility. In some embodiments, the battery management system detects the transition from linear to exponential behavior by monitoring the point at which cell pressure at a given voltage starts to deviate from a linear relationship. In some embodiments, when cell degradation is inferred when a difference between cell pressures measured between successive cycles starts to increase significantly (that is, beyond the norms of the prior cycles).

Detecting battery cell degradation in accordance with one or more embodiments offer several technical advantages over other battery management system. Notably, rapid increases in the difference between cell pressures measured at the same cell voltage in successive cycles serves as an early indicator of battery cell degradation-often front running Coulombic efficiency degradation by several cycles. Consequently, battery management systems described herein can leverage cell pressure progression to identify and mitigate failing battery cells in a manner that is natively more responsive than prior platforms.

Figure 1:
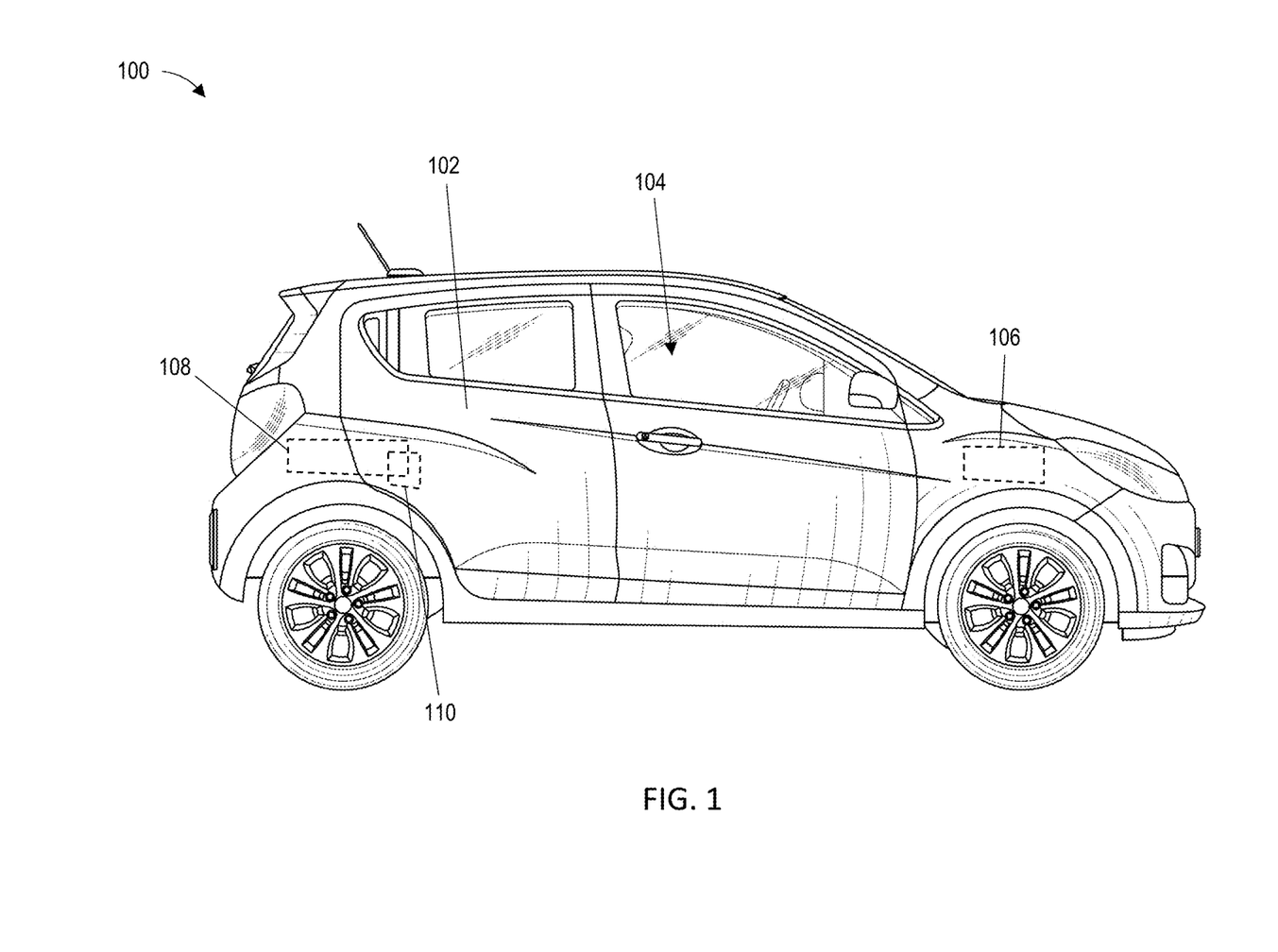
FIG. 1 is a vehicle configured in accordance with one or more embodiments.

A vehicle, in accordance with an exemplary embodiment, is indicated generally at 100 in FIG. 1. Vehicle 100 is shown in the form of an automobile having a body 102. Body 102 includes a passenger compartment 104 within which are arranged a steering wheel, front seats, and rear passenger seats (not separately indicated). Within the body 102 are arranged a number of components, including, for example, an electric motor 106 (shown by projection under the front hood). The electric motor 106 is shown for ease of illustration and discussion only. It should be understood that the configuration, location, size, arrangement, etc., of the electric motor 106 is not meant to be particularly limited, and all such configurations (including multi-motor configurations) are within the contemplated scope of this disclosure.

The electric motor 106 is powered via a battery pack 108 (shown by projection near the rear of the vehicle 100). The battery pack 108 is shown for ease of illustration and discussion only. It should be understood that the configuration, location, size, arrangement, etc., of the battery pack 108 is not meant to be particularly limited, and all such configurations (including split configurations) are within the contemplated scope of this disclosure. Moreover, while the present disclosure is discussed primarily in the context of a battery pack 108 configured for the electric motor 106 of the vehicle 100, aspects described herein can be similarly incorporated within any system (vehicle, building, or otherwise) having an energy storage system(s) (e.g., one or more battery packs), and all such configurations and applications are within the contemplated scope of this disclosure.

As will be detailed herein, the battery pack 108 is monitored and controlled via a battery management system 110 (shown by projection near the battery pack 108). While the battery management system 110 can be included, for example, in a battery pack of an electric vehicle (e.g., the battery pack 108 of vehicle 100), other energy storage applications (for vehicles, structures, or otherwise) are within the contemplated scope of this disclosure.

Figure 2:
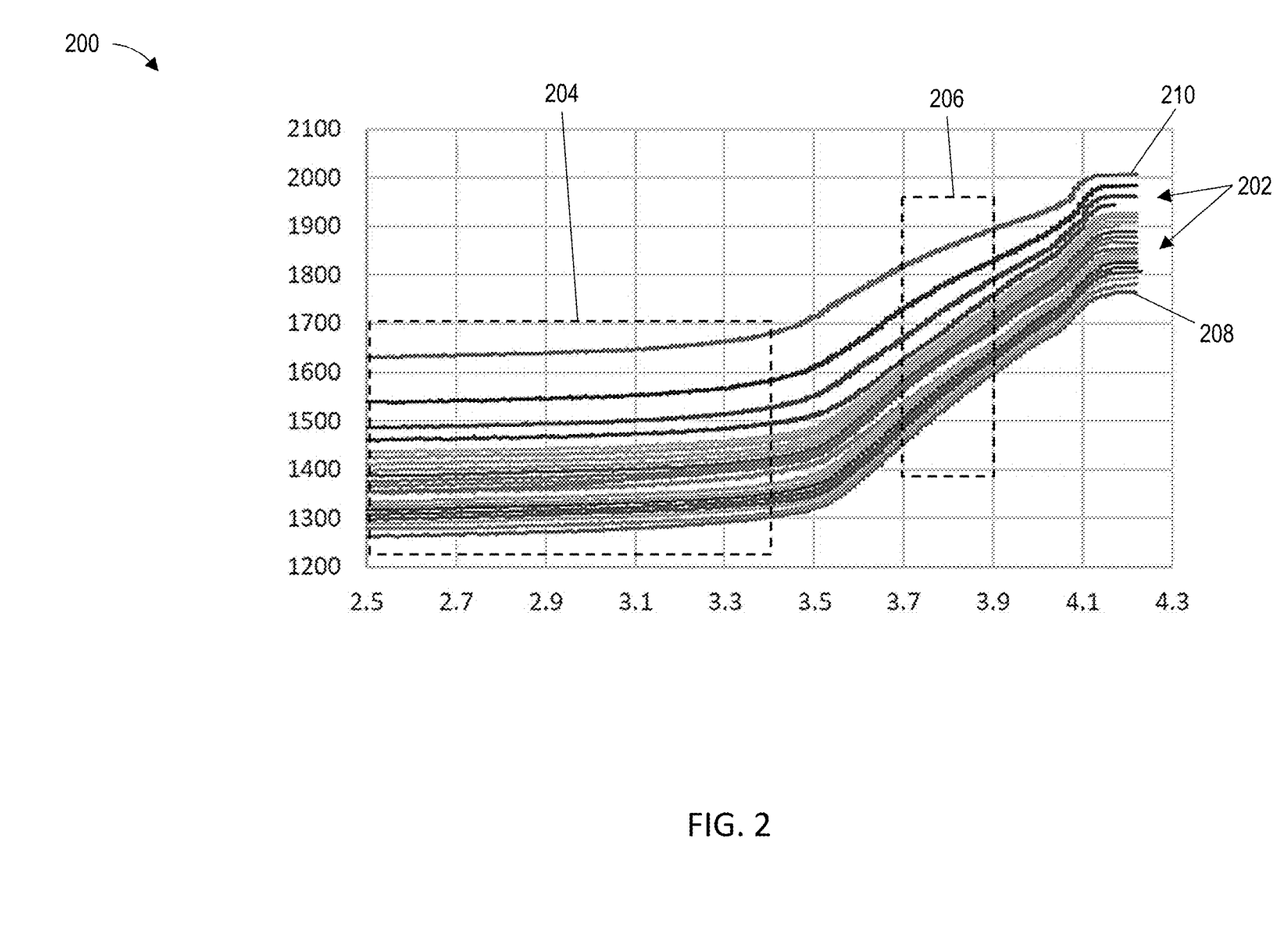
FIG. 2 is a graph depicting the relationship between cell pressure and cell voltage across a number of charge-discharge cycles in accordance with one or more embodiments.

In some embodiments, the battery management system 110 monitors cell pressure as a function of cell voltage across a number of charge-discharge cycles (refer to FIG. 2). Cell pressure can be measured using, for example, a pressure sensor(s) of the battery management system 110 (not separately shown). Alternatively, cell pressure can be measured using upstream systems, for example, using an on-board electronic control unit (ECU, not separately shown) configured to provide cell pressure measurements to the battery management system 110. In yet other embodiments, cell pressure can be estimated. Cell pressure can be estimated, for example, using physics-based or data-driven empirical models, although other techniques for cell pressure estimation are within the contemplated scope of this disclosure.

FIG. 2 illustrates a graph 200 depicting the relationship between cell pressure and cell voltage across a number of charge-discharge cycles 202 in accordance with one or more embodiments. As shown in FIG. 2, cell pressure (here, measured in kPa) increases relatively slowly while progressing from an initial cell voltage of about 2.5 volts to an intermediate cell voltage of about 3.4 volts. This relatively stable region is sometimes referred to as the high hysteresis region 204.

As further shown in FIG. 2, further increases in cell voltage beyond the high hysteresis region 204 result in a more rapid cell pressure response. Observe that, between about 3.7 and about 3.9 volts, cell pressure increases rapidly, but somewhat linearly. This region can be referred to as the measurement region 206. In some embodiments, the battery management system 110 is configured to measure, poll, or otherwise receive cell pressure measurements within the measurement region 206. In some embodiments, the battery management system 110 is configured to measure, poll, or otherwise receive cell pressure measurements at a same reference voltage across a number of charge-discharge cycles 202. In some embodiments, the reference voltage is 3.7, 3.8, or 3.9 volts, although other reference voltages (including those outside of the measurement region 206) are within the contemplated scope of this disclosure.

In some embodiments, the battery management system 110 is configured to take cell pressure measurements at a single (e.g., 3.7 volts) reference voltage across a number of charge-discharge cycles 202. In some embodiments, the battery management system 110 is configured to take cell pressure measurements at two or more reference voltages (e.g., 2.9 volts and 3.9 volts) across a number of charge-discharge cycles 202. In some embodiments, the battery management system 110 is configured to take cell pressure measurements at the reference voltage(s) when charging during one or more of the charge-discharge cycles 202. For example, a cell pressure measurement can be made when the cell voltage increases (due to charging) to 3.7 volts. In some embodiments, the battery management system 110 is configured to take cell pressure measurements at the reference voltage(s) when discharging during one or more of the charge-discharge cycles 202. For example, a cell pressure measurement can be made when the cell voltage decreases (due to driving) to 3.7 volts.

The charge-discharge cycles 202 can include a first (initial) cycle 208 and last (latest) cycle 210. Observe that cell pressure taken at a same (reference) voltage increases along the progression between the first cycle 208 and the last cycle 210. For example, the cell pressure for the first cycle 208 at 3.7 volts is approximately 1425 kPa, while the cell pressure for the last cycle 210 at 3.7 volts is approximately 1810 kPA. This relationship holds within both the high hysteresis region 204 and the measurement region 206. Observe further that the gap (delta) in cell pressures taken at the same voltage between successive cycles is relatively small over an initial set of the charge-discharge cycles 202, but increases rapidly as the charge-discharge cycles 202 approach the last cycle 210. This behavior in the gap (delta) in cell pressure progression is discussed in greater detail with respect to FIGS. 3 and 4.

Figure 3:
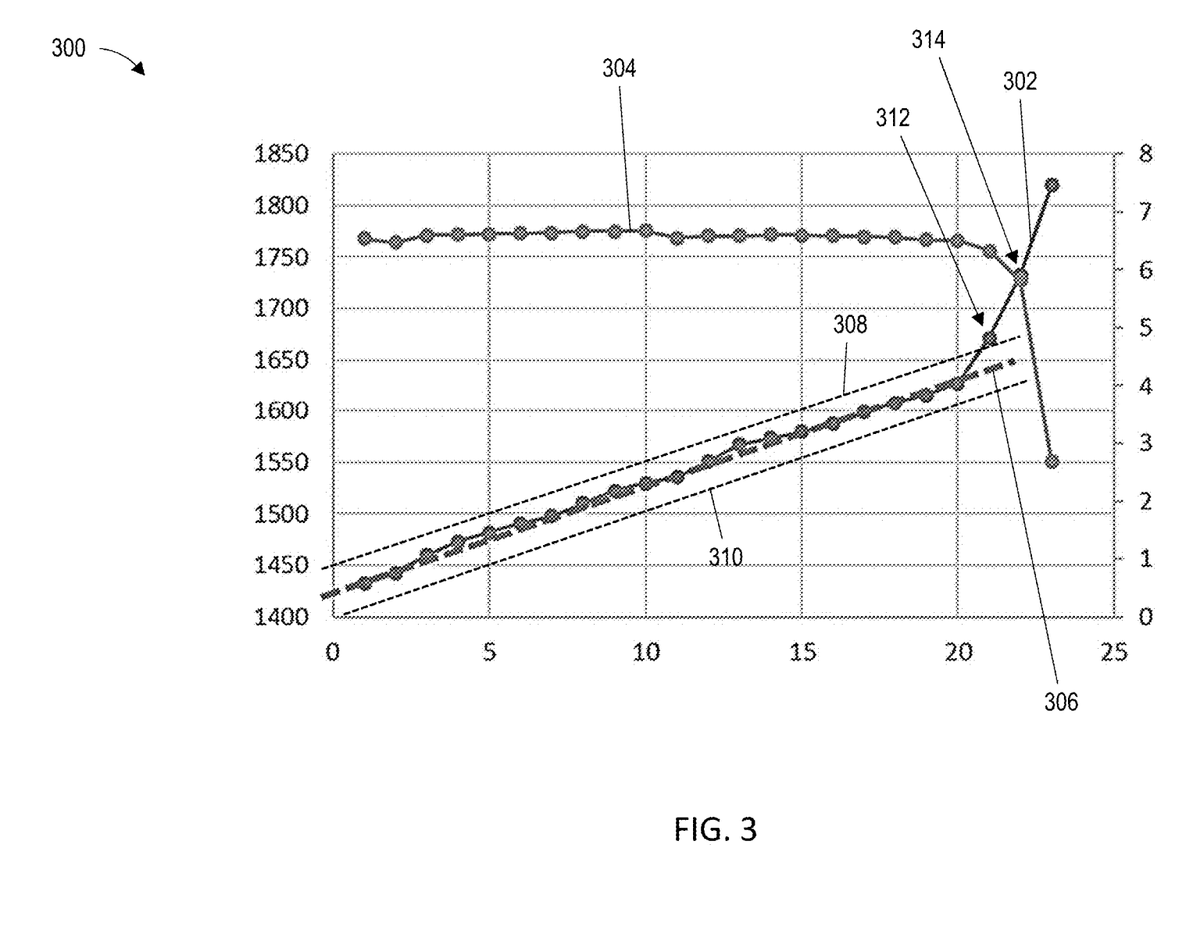
FIG. 3 is a graph depicting an example cell pressure-cycle curve and an example capacity-cycle curve in accordance with one or more embodiments.

FIG. 3 illustrates a graph 300 depicting an example cell pressure-cycle curve 302 and an example capacity-cycle curve 304 in accordance with one or more embodiments. In some embodiments, the cell pressure-cycle curve 302 is constructed by taking a cell pressure measurement at each cycle at a same reference voltage (refer to FIG. 2). Similarly, in some embodiments, the capacity-cycle curve 304 is constructed by measuring Coulombic efficiency (capacity) at each cycle at a same reference voltage. In some embodiments, the reference voltage is 3.7 volts. The cell pressure-cycle curve 302 and the capacity-cycle curve 304 are illustrative only and will vary for a given application.

As shown in the cell pressure-cycle curve 302 of FIG. 3, cell pressure increases linearly from an initial cell pressure of about 1425 kPa to an intermediate cell pressure of about 1625 kPa over 20 charge-discharge cycles. In some embodiments, the battery management system 110 fits a linear regression 306 to the cell pressure data. In some embodiments, an upper threshold 308 and a lower threshold 310 can be constructed from the linear regression 306. For example, the upper threshold 308 and the lower threshold 310 can represent a ±5, 10, 20, 25, 50, 100, etc. percent deviation from the linear regression 306. Equation (1) describes the relatively constant, linear cycle-to-cycle increase in cell pressure due to irreversible expansion (i.e., the linear regression 306):

$$\Delta_{CP} = K \pm \varepsilon \tag{1}$$

where $\Delta_{CP}$ is the change in cell pressure between two cycles, K is a constant (e.g., the slope of the linear increase), and ε represents noise (e.g., a random deviation in cycle-to-cycle cell pressure measurements). The noise ε denotes the limits in equipment and measurement accuracies and can vary, for example, between 0.1 and 5%. Observe that, in FIG. 3, K is 10.6, although K will vary from application to application.

The change in cell pressure ($\Delta_{CP}$, also referred to as "delta CP") can be calculated directly between any two cycles N and M according to the generalized equation (2):

$$\Delta_{CP}|_N := \frac{Pr(V_{monitor,dischg})|_N - Pr(V_{monitor,dischg})|_M}{N - M} \quad (2)$$

where Pr(•) is the measured pressure at the reference voltage and N>M (that is, N is a current cycle and M is a previous cycle).

In some embodiments, the battery management system 110 compares the measured cell pressure at each of the cycles against the upper threshold 308, the lower threshold 310, and/or the linear regression 306. In some embodiments, the battery management system 110 identifies a cell pressure transition cycle 312 (here, the 21$^{st}$ cycle) where the cell pressure exceeds the upper threshold 308. In some embodiments, the battery management system 110 identifies a transition from a linear cell pressure progression to an exponential cell pressure progression at the cell pressure transition cycle 312. In some embodiments, the battery management system 110 identifies a cell degradation condition at the cell pressure transition cycle 312. In some embodiments, the battery management system 110 identifies a fault condition where the cell pressure falls below the lower threshold 310 (indicating, e.g., a punctured cell and/or pressure release).

As shown in the capacity-cycle curve 304 of FIG. 3, battery capacity (e.g., of the battery pack 108 of FIG. 1) is relatively stable (deviations are within 5 percent) until a capacity transition cycle 314 (here, the 22$^{nd}$ cycle). Observe that the capacity transition cycle 314 occurs after the cell pressure transition cycle 312.

Figure 4:
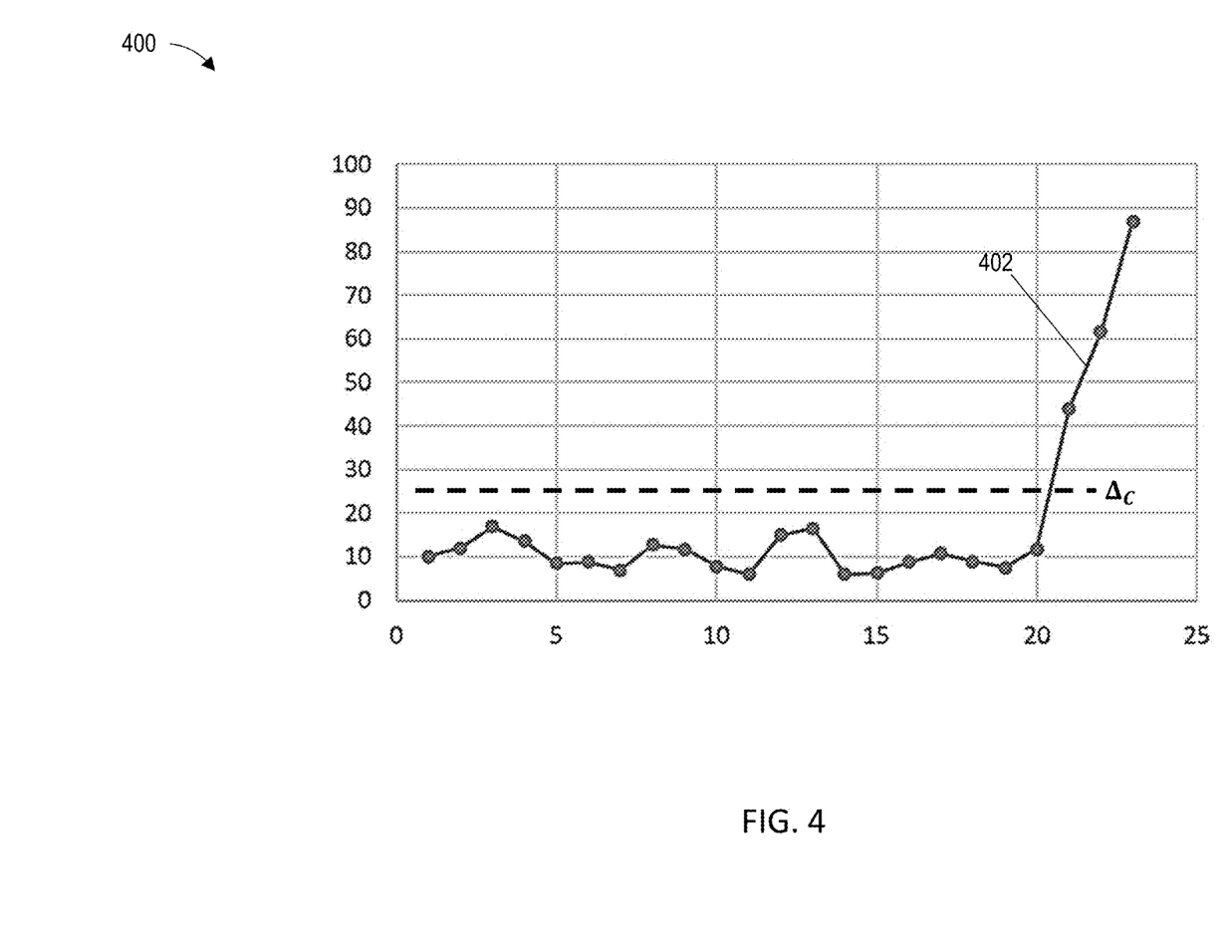
FIG. 4 is a graph depicting an example delta cell pressure-cycle curve over a progression of charge-discharge cycles in accordance with one or more embodiments.

FIG. 4 illustrates a graph 400 depicting an example delta CP-cycle curve 402 over a progression of charge-discharge cycles 202 in accordance with one or more embodiments. As shown in FIG. 4, the change in cell pressure ($\Delta_{CP}$) between cycles remains below a critical cell pressure threshold of about 25 kPa. The critical cell pressure threshold can be referred to as the critical delta CP (or, as shown, $\Delta_C$) and can vary from application to application. In some embodiments, $\Delta_C$ is calibrated from cell-specific test data.

In some embodiments, the battery management system 110 compares the change (delta) in cell pressure data between cycles against the $\Delta_C$. In some embodiments, the battery management system 110 identifies a cell degradation condition when the change (delta) in cell pressure data exceeds $\Delta_C$. For example, the battery management system 110 can identify a cell degradation condition at cycle 21.

Figure 5:
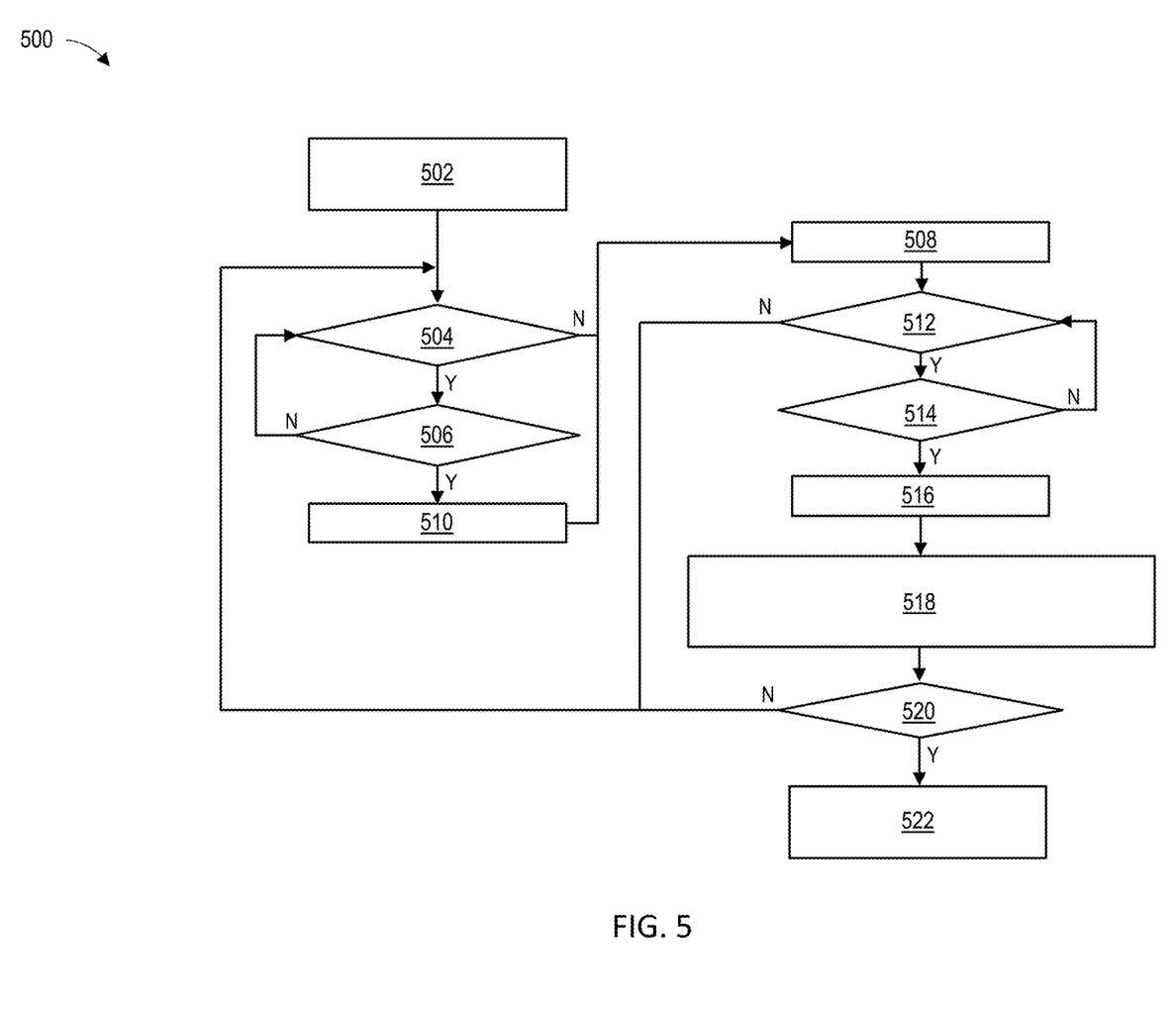
FIG. 5 is a process workflow for detecting cell degradation in accordance with one or more embodiments.

FIG. 5 illustrates a process workflow 500 for detecting cell degradation in accordance with one or more embodiments. The workflow 500 can be carried out using, for example, the battery management system 110 of the vehicle 100 (refer to FIG. 1). The workflow 500 begins at step 502, where cell pressure monitoring is initialized (e.g., cycle N=1) and various thresholds, including, for example, $\Delta_{CP}$, $\Delta_C$, and the reference cell voltage ($V_{REF}$, also referred to as $V_{MONITOR}$) are set.

At step 504, the battery management system 110 determines whether the vehicle 100 is charging. If the vehicle 100 is charging (i.e., YES), the battery management system 110 proceeds to step 506. If the vehicle 100 is not charging (i.e., NO), the battery management system 110 proceeds to step 508.

At step 506, the battery management system 110 determines, after a predetermined delay, whether charging is complete. If the vehicle 100 is still charging (i.e., NO), the battery management system 110 returns to step 504 and, after a predetermined delay, rechecks the charging condition. If the vehicle 100 is no longer charging (i.e., YES), the battery management system 110 proceeds to step 510.

At step 510, a charge counter is incremented (e.g., N=N+1) and the battery management system 110 proceeds to step 508.

At step 508, the battery management system 110 makes (or receives) a cell voltage measurement $V_{CURRENT}$ (also referred to as $V_{DISCHARGING}$).

At step 512, the battery management system 110 checks whether $V_{CURRENT} \geq V_{REF}$. If $V_{CURRENT} < V_{REF}$ (i.e., NO), the battery management system 110 can indicate that the cell voltage was not brought above $V_{REF}$ during the last charge cycle. This can indicate, for example, in incomplete and/or partial recharging operation. In some embodiments, the process can return to step 504 and the battery management system 110 can resume monitoring the charge state. If $V_{CURRENT} \geq V_{REF}$ (i.e., YES), the battery management system 110 can indicate that the cell voltage was brought above $V_{REF}$ during the last charge cycle and the process can proceed to step 514.

At step 514, the battery management system 110 periodically checks, while the battery is discharging (according to any predetermined interval), whether $V_{CURRENT} = V_{REF}$. If $V_{CURRENT} > V_{REF}$ (i.e., NO), the battery management system 110 can indicate that the battery has not sufficiently discharged for a cell pressure measurement. In some embodiments, the process can return to step 512 and the battery management system 110 can resume monitoring cell voltage. If $V_{CURRENT} = V_{REF}$ (i.e., YES), the battery management system 110 can proceed to step 516.

At step 516, the battery management system 110 measures and/or otherwise records a snapshot of cell pressure for the current cycle N (i.e., $Pr(V_{REF})|_N$). In some embodiments, the battery management system 110 proceeds to step 518 after making, retrieving, and/or recording the cell pressure measurement.

At step 518, a change in cell pressure ($\Delta_{CP}$)|N is calculated according to Equation (2). In some embodiments, the battery management system 110 proceeds to step 520 after calculating the change in cell pressure.

At step 520, the battery management system 110 checks whether $\Delta_{CP} > \Delta_C$. If $\Delta_{CP} < \Delta_C$ (i.e., NO), the battery management system 110 can indicate that the change in cell pressure between cycles remains below the critical cell pressure threshold and the process can return to step 504. If $\Delta_{CP} > \Delta_C$ (i.e., YES), the battery management system 110 can indicate that the change in cell pressure between cycles has exceeded the critical cell pressure threshold and the process can proceed to step 522.

In some embodiments, at block 522, the battery management system 110 indicates that the respective battery cell has degraded. In some embodiments, cell degradation is detected in one or more cells of a battery pack, the battery management system 110 can take one or more of a plurality of actions to mitigate the issue and to ensure the safe and optimal operation of the battery pack.

Warning/Alerting: In some embodiments, the battery management system 110 issues a cell degradation warning to a user of the vehicle and/or to an internal system (e.g., the ECU) of the vehicle.

Cell balancing: In some embodiments, the battery management system 110 can initiate cell balancing to equalize a state of charge (SOC) among the cells in a battery pack. Cell balancing can minimize cell-to-cell performance variations and can mitigate the impact of cell degradation in individual cells. In some embodiments, cell balancing involves redistributing energy and/or charge between cells in a battery pack to achieve a more uniform SOC.

Current limits: In some embodiments, if a specific cell is showing signs of degradation, the battery management system 110 can limit the current going into or out of that respective cell during charging and/or discharging processes. Current can be limited, for example, between upper and lower thresholds (i.e., between 15 and 85 percent, etc.). By restricting the current, the battery management system 110 can reduce stress on the degraded cell and can minimize the rate of further cell degradation.

Temperature management: In some embodiments, the battery management system 110 can actively monitor and/or control a temperature(s) of a battery pack. In some embodiments, the battery management system 110 can adjust the charging and/or discharging currents and/or can activate passive or active cooling systems to maintain a target temperature condition in the respective cell.

Fault isolation and cell replacement: In some embodiments, the battery management system 110 can isolate the faulty cell by electrically disconnecting the cell from the system and/or battery pack. In some embodiments, the battery management system 110 can initiate a cell replacement process by identifying the degraded cell for replacement and/or by replacing the cell with a new (backup) cell.

System shutdown: In some embodiments, the battery management system 110 can initiate an automatic shutdown and/or limit the operation of the battery pack responsive to the identification of cell degradation. In some embodiments, the battery management system 110 can request another system (e.g., an ECU) to initiate an automatic shutdown responsive to the identification of cell degradation.

Figure 6:
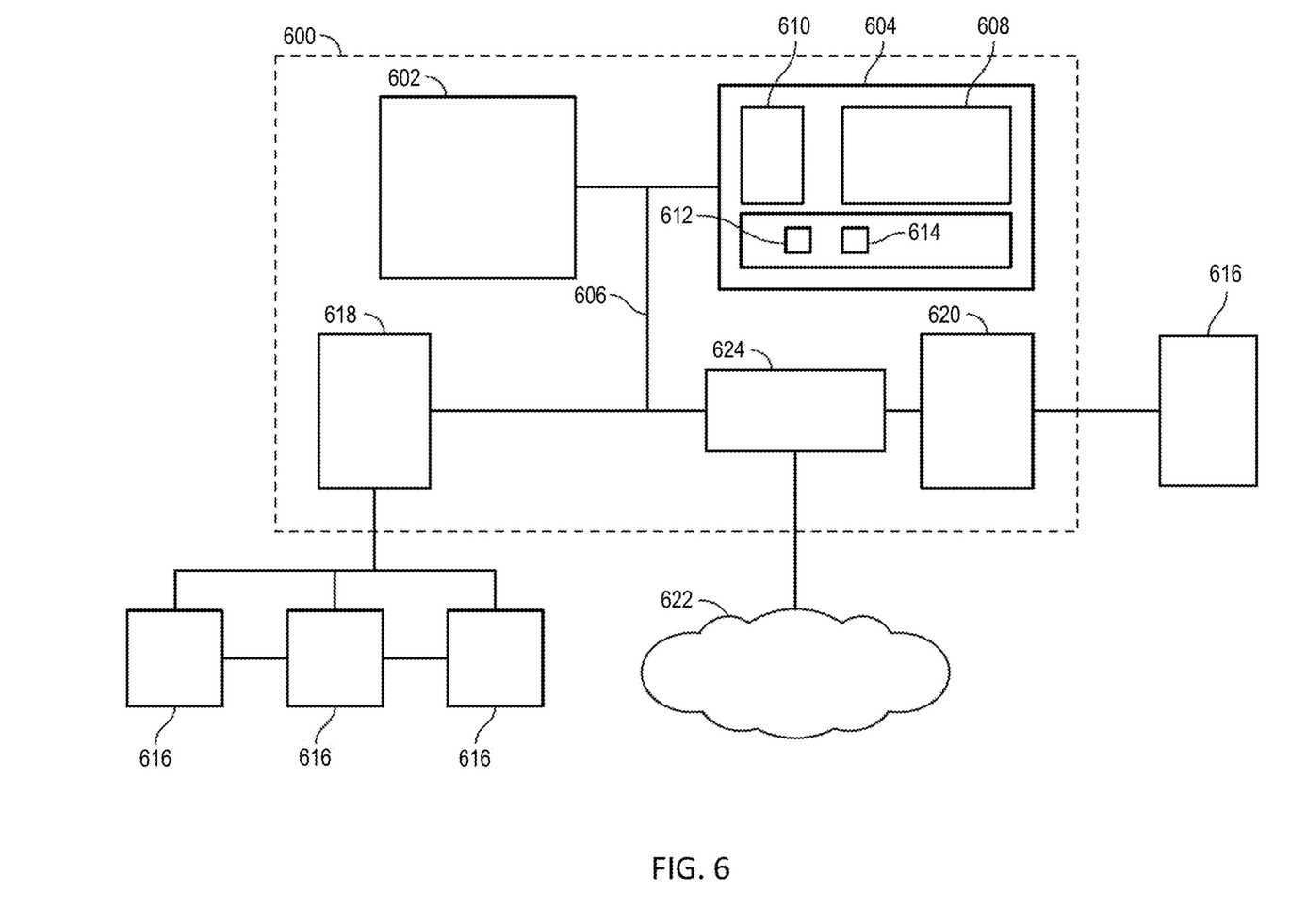
FIG. 6. is a computer system according to one or more embodiments.

FIG. 6 illustrates aspects of an embodiment of a computer system 600 that can perform various aspects of embodiments described herein. In some embodiments, the computer system 600 can be incorporated as a system (e.g., the battery management system 110 of FIG. 1) within or in combination with a battery pack (e.g., the battery pack 108 of FIG. 1). In some embodiments, the computer system 600 can be configured to receive signals (e.g., a cell pressure signal, a cell voltage signal, a state of charge signal, a temperature signal, etc.) from one or more cells of the battery pack.

The computer system 600 includes at least one processing device 602, which generally includes one or more processors for performing a variety of functions, such as, for example, controlling power delivery of an electric motor (e.g., the electric motor 106 of FIG. 1) to one or more wheels of a vehicle (e.g., the vehicle 100), controlling charge/discharge rates of one or more batteries (e.g., the battery pack 108 of FIG. 1), and/or monitoring a status (e.g., cell pressure, cell voltage) of cells of the one or more batteries. In addition, the computer system 600 can include the logic necessary to detect cell degradation and to take appropriate action based on the data (refer to FIG. 5).

Components of the computer system 600 include the processing device 602 (such as one or more processors or processing units), a system memory 604, and a bus 606 that couples various system components including the system memory 604 to the processing device 602. The system memory 604 may include a variety of computer system readable media. Such media can be any available media that is accessible by the processing device 602, and includes both volatile and non-volatile media, and removable and non-removable media.

For example, the system memory 604 includes a non-volatile memory 608 such as a hard drive, and may also include a volatile memory 610, such as random access memory (RAM) and/or cache memory. The computer system 600 can further include other removable/non-removable, volatile/non-volatile computer system storage media.

The system memory 604 can include at least one program product having a set (e.g., at least one) of program modules that are configured to carry out functions of the embodiments described herein. For example, the system memory 604 stores various program modules that generally carry out the functions and/or methodologies of embodiments described herein. A module or modules 612, 614 may be included to perform functions related to monitoring and/or control of the battery pack 108, such as, for example, determining one or more current cell temperatures, a current state of charge for the battery pack 108 and/or any cell of the battery pack 108, a charging duration, a charging current and/or voltage, etc. The computer system 600 is not so limited, as other modules may be included depending on the desired functionality of the vehicle 100. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality. For example, the module(s) can be configured via software, hardware, and/or firmware to stop charging and/or otherwise isolate one or more cells of a battery pack of the vehicle 100.

The processing device 602 can also be configured to communicate with one or more external devices 616 such as, for example, a keyboard, a pointing device, and/or any devices (e.g., a network card, a modem, vehicle ECUs, etc.) that enable the processing device 602 to communicate with one or more other computing devices. Communication with various devices can occur via Input/Output (I/O) interfaces 618 and 620.

The processing device 602 may also communicate with one or more networks 622 such as a local area network (LAN), a general wide area network (WAN), a bus network and/or a public network (e.g., the Internet) via a network adapter 624. In some embodiments, the network adapter 624 is or includes an optical network adaptor for communication over an optical network. It should be understood that although not shown, other hardware and/or software components may be used in conjunction with the computer system 600. Examples include, but are not limited to, microcode, device drivers, redundant processing units, external disk drive arrays, RAID systems, and data archival storage systems, etc.

Figure 7:
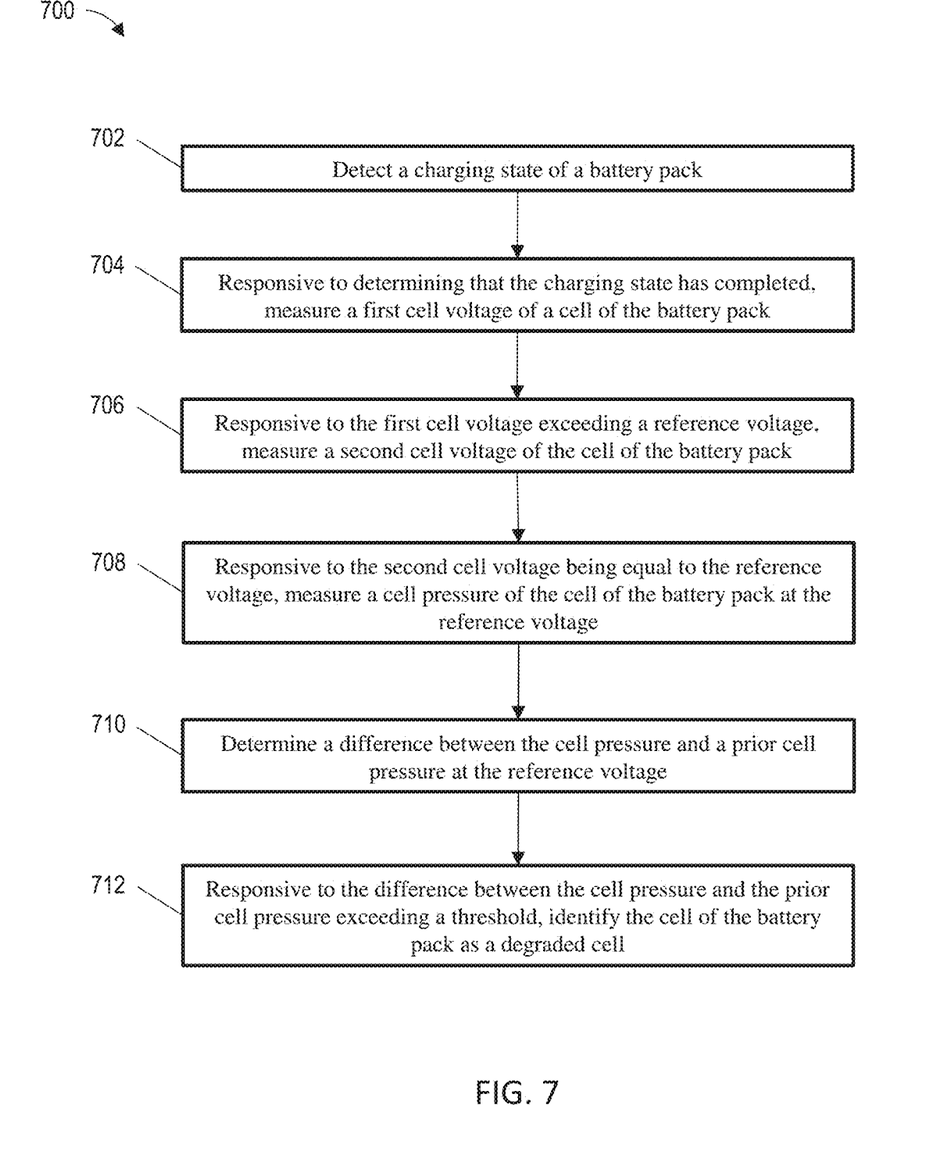
FIG. 7 is a flowchart in accordance with one or more embodiments.

Referring now to FIG. 7, a flowchart 700 for detecting battery cell degradation is generally shown according to an embodiment. The flowchart 700 is described in reference to FIGS. 1 to 6 and may include additional steps not depicted in FIG. 7. Although depicted in a particular order, the blocks depicted in FIG. 7 can be rearranged, subdivided, and/or combined.

At block 702, a charging state of a battery pack is detected. In some embodiments, the charging state indicates whether the battery pack is charging, at rest, or discharging.

At block 704, a first cell voltage of a cell of the battery pack is measured responsive to determining that the charging state has completed. In some embodiments, responsive to determining that the charging state has completed, a charge counter is incremented.

At block 706, a second cell voltage of the cell of the battery pack is measured responsive to the first cell voltage exceeding a reference voltage.

At block 708, a cell pressure of the cell of the battery pack is measured at the reference voltage responsive to the second cell voltage being equal to the reference voltage.

At block 710, a difference is determined between the cell pressure and a prior cell pressure at the reference voltage.

At block 712, the cell of the battery pack is identified as a degraded cell responsive to the difference between the cell pressure and the prior cell pressure exceeding a threshold.

In some embodiments, responsive to identifying the cell of the battery pack as a degraded cell, a cell degradation warning is issued.

In some embodiments, responsive to identifying the cell of the battery pack as a degraded cell, a cell balancing is completed to equalize a state of charge among a plurality of cells of the battery pack.

In some embodiments, responsive to identifying the cell of the battery pack as a degraded cell, current into and/or out of the cell is limited during a charging and/or discharging process.

In some embodiments, responsive to identifying the cell of the battery pack as a degraded cell, a charging and/or discharging current is adjusted to maintain a target temperature condition in the cell and/or battery pack.

In some embodiments, responsive to identifying the cell of the battery pack as a degraded cell, the cell is isolated by electrically disconnecting the cell from the battery pack.

The terms "a" and "an" do not denote a limitation of quantity, but rather denote the presence of at least one of the referenced items. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A vehicle comprising:
an electric motor;
a battery pack electrically coupled to the electric motor; and
a battery management system coupled to the battery pack, the battery management system comprising a memory, computer readable instructions, and one or more processors for executing the computer readable instructions, the computer readable instructions controlling the one or more processors to perform operations comprising:
detecting a charging state of the battery pack;
responsive to determining that the charging state has completed, measuring a first cell voltage of a cell of the battery pack;
responsive to the first cell voltage exceeding a reference voltage, measuring a second cell voltage of the cell of the battery pack;
responsive to the second cell voltage being equal to the reference voltage, measuring a cell pressure of the cell of the battery pack at the reference voltage;
determining a difference between the cell pressure and a prior cell pressure at the reference voltage; and
responsive to the difference between the cell pressure and the prior cell pressure exceeding a threshold, identifying the cell of the battery pack as a degraded cell.

2. The vehicle of claim 1, further comprising, responsive to determining that the charging state has completed, incrementing a charge counter.

3. The vehicle of claim 1, further comprising, responsive to identifying the cell of the battery pack as a degraded cell, issuing a cell degradation warning.

4. The vehicle of claim 1, further comprising, responsive to identifying the cell of the battery pack as a degraded cell, completing a cell balancing to equalize a state of charge among a plurality of cells of the battery pack.

5. The vehicle of claim 1, further comprising, responsive to identifying the cell of the battery pack as a degraded cell, limiting current into or out of the cell during a charging or discharging process.

6. The vehicle of claim 1, further comprising, responsive to identifying the cell of the battery pack as a degraded cell, adjusting a charging or discharging current to maintain a target temperature condition in the cell.

7. The vehicle of claim 1, further comprising, responsive to identifying the cell of the battery pack as a degraded cell, isolating the cell by electrically disconnecting the cell from the battery pack.

8. A battery management system comprising a memory, computer readable instructions, and one or more processors for executing the computer readable instructions, the computer readable instructions controlling the one or more processors to perform operations comprising:
detecting a charging state of a battery pack;
responsive to determining that the charging state has completed, measuring a first cell voltage of a cell of the battery pack;

responsive to the first cell voltage exceeding a reference voltage, measuring a second cell voltage of the cell of the battery pack;

responsive to the second cell voltage being equal to the reference voltage, measuring a cell pressure of the cell of the battery pack at the reference voltage;

determining a difference between the cell pressure and a prior cell pressure at the reference voltage; and responsive to the difference between the cell pressure and the prior cell pressure exceeding a threshold, identifying the cell of the battery pack as a degraded cell.

9. The battery management system of claim 8, wherein the one or more processors perform operations further comprising, responsive to determining that the charging state has completed, incrementing a charge counter.

10. The battery management system of claim 8, wherein the one or more processors perform operations further comprising, responsive to identifying the cell of the battery pack as a degraded cell, issuing a cell degradation warning.

11. The battery management system of claim 8, wherein the one or more processors perform operations further comprising, responsive to identifying the cell of the battery pack as a degraded cell, completing a cell balancing to equalize a state of charge among a plurality of cells of the battery pack.

12. The battery management system of claim 8, wherein the one or more processors perform operations further comprising, responsive to identifying the cell of the battery pack as a degraded cell, limiting current into or out of the cell during a charging or discharging process.

13. The battery management system of claim 8, wherein the one or more processors perform operations further comprising, responsive to identifying the cell of the battery pack as a degraded cell, adjusting a charging or discharging current to maintain a target temperature condition in the cell.

14. The battery management system of claim 8, wherein the one or more processors perform operations further comprising, responsive to identifying the cell of the battery pack as a degraded cell, isolating the cell by electrically disconnecting the cell from the battery pack.

15. A method for detecting battery cell degradation, the method comprising:

detecting a charging state of a battery pack;

responsive to determining that the charging state has completed, measuring a first cell voltage of a cell of the battery pack;

responsive to the first cell voltage exceeding a reference voltage, measuring a second cell voltage of the cell of the battery pack;

responsive to the second cell voltage being equal to the reference voltage, measuring a cell pressure of the cell of the battery pack at the reference voltage;

determining a difference between the cell pressure and a prior cell pressure at the reference voltage; and responsive to the difference between the cell pressure and the prior cell pressure exceeding a threshold, identifying the cell of the battery pack as a degraded cell.

16. The method of claim 15, further comprising, responsive to determining that the charging state has completed, incrementing a charge counter.

17. The method of claim 15, further comprising, responsive to identifying the cell of the battery pack as a degraded cell, issuing a cell degradation warning.

18. The method of claim 15, further comprising, responsive to identifying the cell of the battery pack as a degraded cell, completing a cell balancing to equalize a state of charge among a plurality of cells of the battery pack.

19. The method of claim 15, further comprising, responsive to identifying the cell of the battery pack as a degraded cell, limiting current into or out of the cell during a charging or discharging process.

20. The method of claim 15, further comprising, responsive to identifying the cell of the battery pack as a degraded cell, adjusting a charging or discharging current to maintain a target temperature condition in the cell.

* * * * *